United States Patent [19]

Cluniat

[11] 4,392,252
[45] Jul. 5, 1983

[54] SIGNAL TRANSMISSION SYSTEM COMPRISING A MONOLINEARITY PRODUCT PRECORRECTION DEVICE

[75] Inventor: Claude Cluniat, Chatou, France

[73] Assignee: L.G.T. Laboratoire General des Telecommunications, Chatou, France

[21] Appl. No.: 262,427

[22] Filed: May 11, 1981

[30] Foreign Application Priority Data

May 14, 1980 [FR] France ................. 80 10847

[51] Int. Cl.³ .................. H04B 1/04; H03F 1/26
[52] U.S. Cl. ................... 455/116; 455/72; 358/186; 330/124 R; 330/144; 330/149
[58] Field of Search .......... 455/63, 72, 91, 116, 455/303; 358/186; 370/7; 333/14; 328/163; 330/144, 145, 149, 151, 124 R

[56] References Cited

U.S. PATENT DOCUMENTS

| | | | |
|---|---|---|---|
| 3,559,068 | 1/1971 | Almering et al. | 455/72 |
| 3,693,109 | 9/1972 | Swerdlow . | |
| 4,130,807 | 12/1978 | Hall et al. | 330/149 |
| 4,131,859 | 12/1978 | Valle | 330/149 |
| 4,217,554 | 8/1980 | Brzozowski | 330/149 |
| 4,329,655 | 5/1982 | Nojima et al. | 330/149 |

FOREIGN PATENT DOCUMENTS 2394214 10/1976 France .
2312152 12/1976 France .

*Primary Examiner*—Jin F. Ng
*Attorney, Agent, or Firm*—Oblon, Fisher, Spivak, McClelland & Maier

[57] ABSTRACT

A signal transmission system, particularly for television, comprising a nonlinearity precorrection device having a principal channel and a subsidiary channel. The subsidiary channel comprises a nonlinearity product generator with two amplification channels, a linear channel and a nonlinear channel which enable nonlinearity products having a suitable phase to be extracted by the difference of their output signals. The principal channel comprises a circuit formed from two linear channels in parallel whose output signals are added together in an adder. The output signals of the subsidiary channel and the principal channel are added. This precorrection device enables automatic correction of the nonlinearity products to be set up.

5 Claims, 4 Drawing Figures

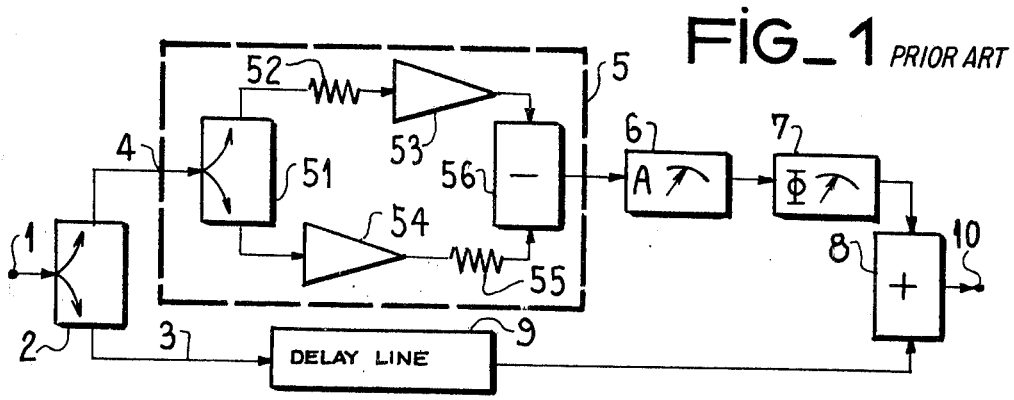
FIG_1 PRIOR ART
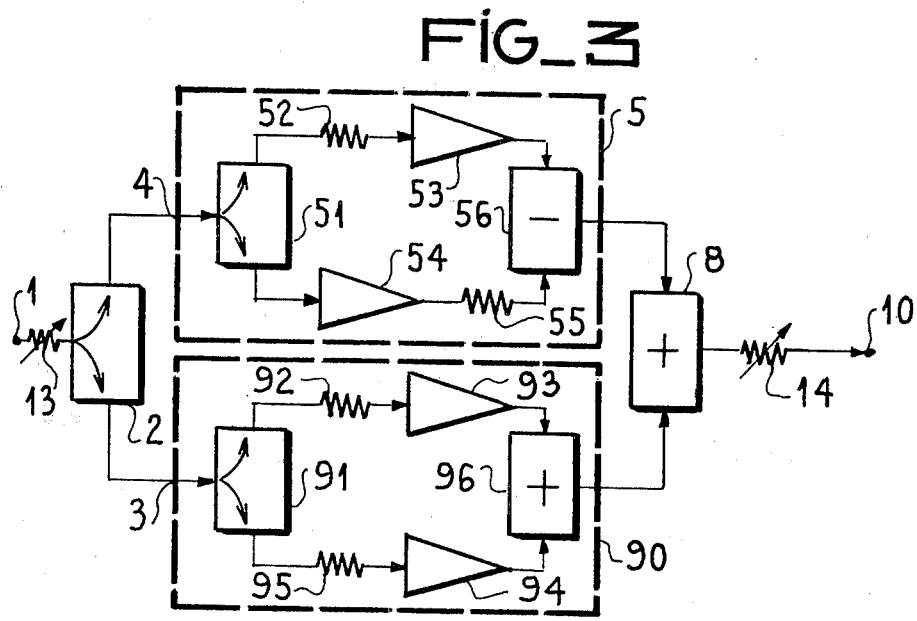
FIG_3
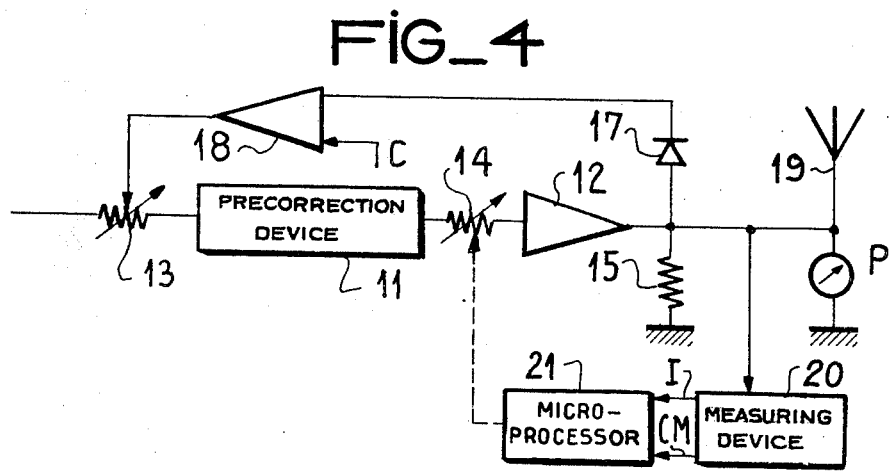
FIG_4

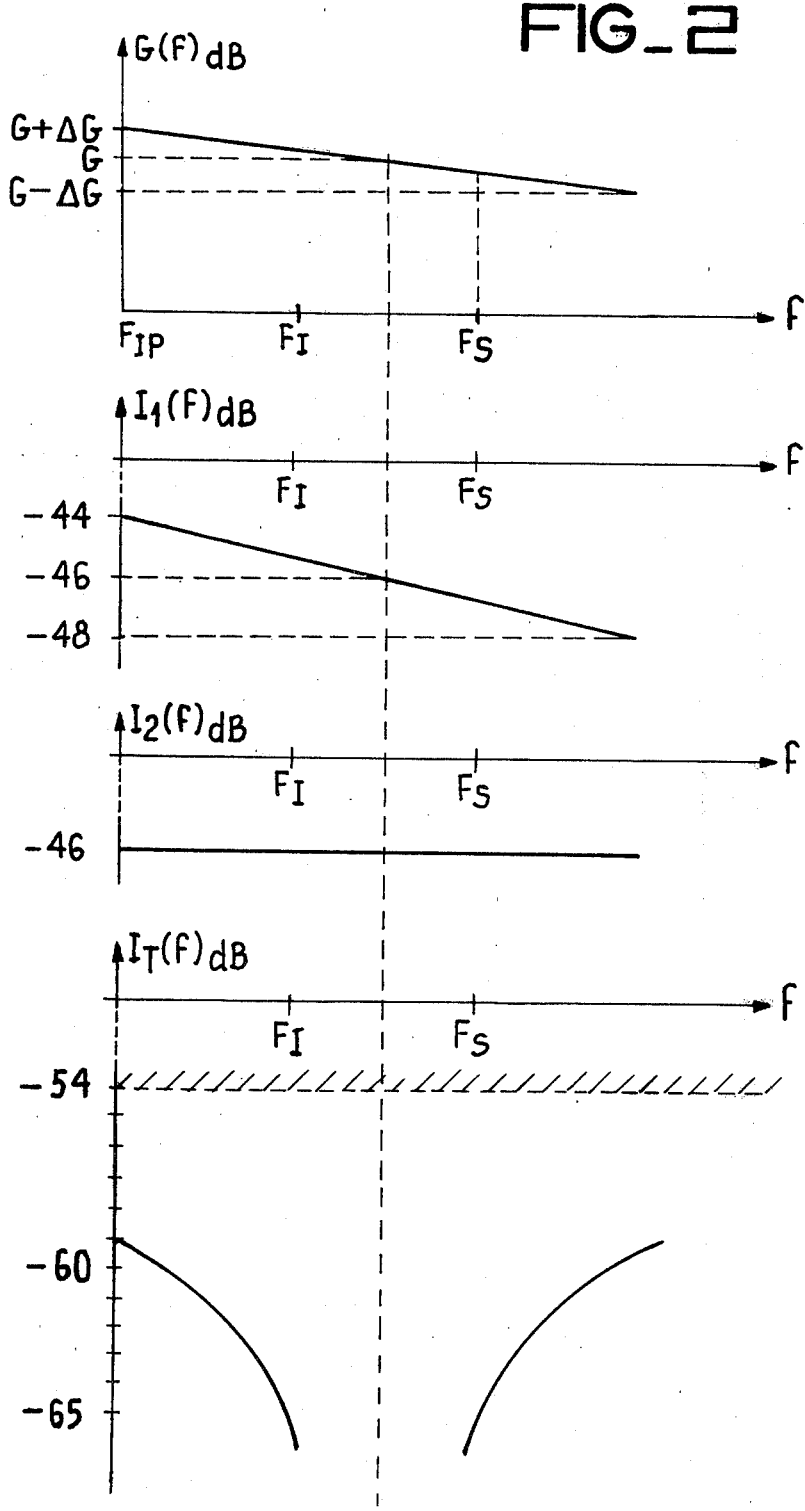

SIGNAL TRANSMISSION SYSTEM COMPRISING A MONOLINEARITY PRODUCT PRECORRECTION DEVICE

BACKGROUND OF THE INVENTION

The invention relates to a television signal transmitting system comprising a device for precorrecting products of nonlinearity.

The transmission of television signals requires very linear systems, either at the level of the low-noise reception amplifiers, at the level of the intermediate-frequency converters or at the level of the power stages of the transmitter.

In fact, a television signal wich is composed of an amplitude-modulated image carrier and a sound carrier modulated in accordance with the amplitude or frequency standard, must be amplified very linearly for the demodulated signal to be faithful. The nonlinearities obtained in one stage cause impairment of the transmitted signals. There can for example be observed in the image channel a modification of the contrast, of the colors, and in the sound channel a distortion of the low frequencies. They may also cause, in the case where the image and sound signals are amplified simultaneously, extremely troublesome disturbing phenomena due to the modulation transfers or cross-modulation from one carrier to the other which result in giving the images a watery effect, degradation of the signal/noise ratio, etc. . . .

For all these reasons, television transmission and retransmission equipment of low or medium power (1 watt to 1 kilowatt) comprise Class A biased amplifiers, which leads to an efficiency between 5 and 10%. This efficiency may be substantially increased with devices for correcting nonlinearities.

Different types of precorrection are used at the present time, for television transmitters with separate sound and image channels or with common channels, in particular, videofrequency or intermediate-frequency threshold precorrection devices, or devices of the negative feedback type comprising a device reinjecting into the system nonlinearity products obtained by comparison of the signals before and after processing by the output amplifier.

All these solutions have the drawback of being specific to the transmission systems to which they are applied and in particular all these devices are in general fairly difficult to adjust. In fact, several adjustments are required and these adjustments interact.

A particular precorrection device comprising a generator of nonlinearity products has been described in French patent application No. 75 16062 filed on May 23, 1975 in the name of the Applicant. The generator of nonlinearity products has a law of the same nature as the output amplifier. Its energization level is chosen so that it reaches the same distortion point. The input signal $U_e$ is transmitted symmetrically to this generator and to a delay line which equalizes the respective delays of the two channels. The signals supplied by the generator of nonlinearity products of form $k'_3 U_e^3$, in phase opposition with the nonlinearity products generated by the amplifier to be corrected of form $-k_3 U_e^3$, are then combined with the signal emerging from the delay line $U_e$. Thus the amplitude-amplitude curve of the signal, compressed in the output amplifier (because in particular of this nonlinearity term of order 3, $-k_3 U_e^3$ which is subtracted from the term $k_1 U_e$ of linear amplification), undergoes preliminary expansion by the precorrection device which may counterbalance, after amplification, the nonlinearity products introduced so that the resulting signal has minimum distortion. This type of precorrection presents excellent stability and an efficiency which is naturally variable when the level of the input signal varies. In fact, when the input signal decreases, the distortion of the output stage and at the same time that of the precorrector decrease with the same rapidity. There is then correction in a wide range.

But the amplitude-frequency characteristic of the nonlinearity product generator is not perfectly flat over the whole frequency range, and because of the phase and group delay time dissymmetries of the two channels, a variable phase shifter must be introduced so as to re-establish in a given frequency range a correct symmetry.

Such a precorrector is fairly simple to adjust since it is sufficient to adjust the amplitude of the nonlinearity products generated and the relative phase of the two channels. But these adjustments must be effected by successive approximations with respect to each other and must be carried out after each variation of the intermodulation level.

The precorrection device described above does not then lend itself, from a measurement of nonlinearity products, to a simple automatic correction.

SUMMARY OF THE INVENTION

The invention has as object a transmission system comprising a precorrection device of the type described above, but improved with respect thereto in that the delay line of the principal channel of the precorrection device is replaced by a circuit having the same delay time of the group and the same amplitude-frequency characteristic as those of the nonlinearity product generator of the subsidiary channel. Thus, the correction takes place in a very wide band. Moreover, the system is such that there only remains one adjustment which leads itself readily to automatic correction.

Finally, this device may be produced by micro-electronic techniques, which allows a very compact device to be obtained and passbands of several decades.

According to the invention, a transmission system comprising a device for precorrection of nonlinearity products introduced by an amplifier stage of this system, the precorrection device comprising a signal input coupled through a power dispatcher to a principal linear channel and to a subsidiary channel comprising a nonlinearity product generator; this generator comprising: a power dispatcher supplying in parallel a linear amplification channel and a nonlinear amplification channel, and a subtractor effecting the difference between the output signal of the linear channel and the output signal of the nonlinear channel so as to generate only nonlinearity products opposite in phase to the nonlinearity products to be corrected; an output adder connected to the outputs of the principal channel and of the subsidiary channel delivering a signal which is the sum of the signals supplied by these two channels, is principally characterized in that the principal channel comprises: a power dispatcher supplying in parallel two linear amplification channels similar to the linear channel of the nonlinearity products generator, an adder combining the output signals of these two linear channels into one signal transmitted to the output adder, a device for adjusting the amplitude of the nonlinearity products being provided.

DESCRIPTION OF THE DRAWINGS

The invention will be better understood and other characteristics will appear from the following description which refers to the accompanying figures.

FIG. 1 shows a precorrection device of the type comprising a nonlinearity product generator of the prior art.

FIG. 2 shows characteristic curves of the device of FIG. 1.

FIG. 3 is a diagram of the precorrection device of the transmission system in accordance with the invention.

FIG. 4 is the block diagram of the last stage of the tramsmitter of the transmission system according to the invention, with automatic precorrection.

DESCRIPTION OF THE PRIOR ART

The precorrection device of the prior art will be described herebelow with reference to FIG. 1.

As indicated briefly above, the precorrection device described in the above-mentioned patent application comprises principally, supplied by the input 1, an input dispatcher 2 whose two outputs 3 and 4 form the inputs of two channels: a principal channel transmitting the signal to be amplified by the output amplifier whose intermodulation and cross-modulation it is desired to correct, and a subsidiary channel comprising a nonlinearity product generator 5. This generator comprises two identical amplifiers 53 and 54 whose energization levels are very different. For that, input 4 is connected to a dispatcher 51 one output of which is connected to the input of amplifier 53 through an attenuator 52 so as to form a linear amplification channel and the other output 51 of which is connected directly to amplifier 54, an attenuator 55 being placed at the output of this amplifier so as to form a nonlinear amplification channel; the levels of the signals in the linear channel and in the nonlinear channel are equal, except for the nonlinearity products, before recombination in an output coupler 56. This output coupler is a differential coupler which extracts from the signals present at the two inputs the parts which are not common to these two signals, i.e. the nonlinearity products opposite in phase to the nonlinearity products generated by the amplifier to be corrected. In fact, amplifier 53, driven at a low level, produces practically no distortion. On the other hand, amplifier 54, driven at a higher level, produces distortions. The output of the nonlinearity product generator thus formed is connected to the input of an amplitude-control circuit 6 whose output is itself connected to the input of a phase-control circuit 7. The emerging signal is then coupled in an output adder 8 with the signal transmitting through the principal channel which comprises only a delay line 9. The output 10 of adder 8 then delivers a signal in which the distortion introduced by the nonlinearity products is in the opposite direction to the distortion to be corrected. But as pointed out above, the dissymmetry of the principal channel comprising the delay line, and the subsidiary channel, comprising the nonlinearity generator, results in the distortion not being created in quite the same way in the whole frequency band, the delay line of the group and the amplitude-frequency characteristic of the nonlinearity product generator being obviously different in the two channels, as was pointed out above.

In order to make, during use, a measurement of the nonlinearity products for achieving automatic precorrection in a transmission system in use, a nonlinearity product generated outside the effective band may be used. Such a device for measuring, during use, nonlinearity products has been described in French patent application No. 79 31 488 filed on Dec. 21, 1979 in the name of the applicant.

For the measurement to be exact, it is absolutely necessary for the correction to take place with the same efficiency and in accordance with the same phase law within the effective band and outside this band, where the intercarrier product used for the measurement may be taken by simple filtering (for example the component at $2F_I - F_S$, where $F_I$ is the image carrier frequency and $F_S$ the sound carrier frequency).

The curves shown in FIG. 2 bring out better the faults to be corrected so as to be able to make an exact measurement of the intermodulation rate. The first curve shows the variation of the gain of the nonlinearity product generator 5 in the frequency band G(f), G being the gain for the central frequency of the band. This gain varies on each side of G by $\pm \Delta G$. The amplitude $I_1$ of the nonlinearity products generated by generator 5 is then not constant in the whole frequency band, for an equal input level. Its variation is shown by the second curve of FIG. 2, $I_1(f)dB$. On the other hand, the delay line 9 has no influence on the level $I_2(f)dB$ of the nonlinearity products to be corrected, shown as a function of the frequency, in the third curve of FIG. 2.

Consequently, assuming that the nonlinearity products counterbalance each other exactly for the central frequency, the resulting level of the intermodulation products $I_T$, whose expression as a function of $I_1$ and $I_2$ is:

$I_{TdB} = 20 \text{ Log } (|10^{-I_2/20} - 10^{-I_1/20}|)$ varies on each side of this central frequency. The fourth curve of FIG. 2 shows this variation of the remaining amplitude of the nonlinearity products as a function of the frequency. It should be noted that $I_T$ always remains very much less than the 54 dB required by international standards in the whole frequency range of a television channel.

DESCRIPTION OF THE PREFERRED EMBODIMENT

FIG. 3 shows the precorrection device of the system in accordance with the invention.

In FIG. 3, the same elements as in FIG. 1 have been shown by the same reference numbers.

In this precorrection device, input 1 is connected to the input of a power dispatcher 2 by means of a variable attenuator 13. The two outputs 3 and 4 of this dispatcher feed respectively a principal channel and a subsidiary channel. The subsidiary channel comprises as before a nonlinearity product generator 5 identical to that used in the device described with reference to FIG. 1. On the other hand, the delay line 9 of the device of this same FIG. 1 is replaced, in the precorrection device of the invention, by a circuit 90 comprising the same components as the nonlinearity product generator 5, i.e. an input power dispatcher 91 exactly similar to dispatcher 51, two amplifiers 93 and 94 identical with the amplifiers 53 and 54, and two attenuators 92 and 95 identical to the attenuators 52 and 55 insofar as their phase and group delay time characteristics are concerned but whose attenuations may possibly be different. These components are assembled so that this circuit 90 is perfectly linear and does not then introduce any nonlinearity products. For that, the two circuit channels are organized in the same way as the so-called linear channel of the nonlinearity product generator. That is to say that amplifiers 93 and 94 are driven at low energization levels, attenuators 92 and 95 being placed upstream of these amplifiers. The output signals of amplifiers 93 and 94 feed the two inputs of an adder 96.

The signal emerging from this circuit 90 has the same group delay time as that transitting through the subsidiary channel comprising the nonlinearity product generator, and this signal undergoes the same attenuations as a function of the frequency because the amplitude-frequency characteristic of this principal channel is exactly the same as that of the subsidiary channel. A variable attenuator 14 is disposed between the output of adder 8 and the output 10 of the precorrection device for adjusting the output power of the equipment in which it is inserted.

So that the transmittance of this device remains constant, the two attenuators 13 and 14 are coupled so that the sum of the attenuations in dB is constant.

This device is very advantageously formed with micro-electronic components. In fact, there exist at present wideband amplifiers formed with transistors, their bands being able to cover the band 5 MHz to 1000 MHz. The adder and dispatcher circuits such as 8, 96 and 2, 51 and 91, and circuit 56 effecting the difference may be either 0° or 180° phase-shift ferrite couplers (adder, dispatcher or subtractor respectively), when the band does not exceed 250 MHz, or 3-decibel couplers whose sum access or difference access is used. The attenuators may be electronic attenuators (PIN diodes) developed by thin-layer micro-electronic techniques.

This new arrangement leads to considerable simplification insofar as the adjustments to be carried out are concerned. In fact, because of the perfet symmetry of the two channels, subsidiary channel and principal channel, no additional variable element need be provided in these two channels and the amplitude and phase control circuits (6 and 7 of FIG. 1) are now useless. The only adjustments which remain are those of the attenuators 13 and 14 and these adjustments are coupled, an attenuation $A - \Delta A$ by attenuator 13 resulting in an attenuation $A + \Delta A$ by attenuator 14 so that the output power remains unchanged. The adjustment may moreover be carried out automatically by a control loop which, from an amplitude variation of the nonlinearity products generated by the precorrection device, determining the efficiency of the correction of the nonlinearity products generated by the amplifier to be corrected, acts automatically on the amplitude of the input voltage so that the output power of the amplifier remains constant.

The correction device thus constructed has a wide band and may then be associated with a device for measuring during use the nonlinearity products; such a measurement allowing a system to be used in which the precorrection is effected automatically from a nonlinearity measurement by the measuring device.

FIG. 4 shows the last stage of the television signal transmission system (transmission or retransmission) comprising such a precorrection device, with automatic precorrection. The circuit shown in FIG. 3 (except for attenuators 13 and 14) i.e. the precorrection device, is shown generally by 11 in this figure. The input of the stage is connected to the input of the precorrection device by the electrically controllable variable attenuator 13.

The output of precorrection device 11 is connected to the input of the output amplifier 12 through the electric-control variable attenuator 14. The output of this amplifier 12 feeds a transmitting aerial. The output power P may be measured by means of a device 16, a load 15 being disposed at the output of amplifier 12. By acting, within the frequency band, on the attenuation coefficient of the variable attenuator 14, the negative feedback loop formed by a detector 17 and a comparator 18 fed at one of its inputs by detector 17 and at the other by a reference voltage C, supplies to the variable attenuator 13 a control signal proportional to the error voltage formed by the difference between the voltage detected by detector 17 and the reference voltage C. So as to determine the optimum in which the intermodulation and the cross-modulation are minimum, a measuring device 20 (which provides filtering of an intercarrier product situated outside the effective band of the transmitted signal, for example the product $2F_I - F_S$, as described above) gives, by comparison with reference levels taken from the effective signal, a measure of the intermodulation I and the cross-modulation CM in the transmitted signal. These two values, available in binary form, are transmitted to a microprocessor 21 which computes the amplitude to be given to the nonlinearity products generated by the precorrection device and which supplies then the control signal to the variable attenuator 14.

As is clear from the above description, the precorrection device is very flexible in use and greatly facilitates the maintenance of such equipment.

Moreover, because all its elements may be formed with micro-electronic techniques, its bulk is very small and it may even be introduced into equipment already existing. It is also very easy to introduce into very-low-power equipment (which are also of very small volume). The cross-modulation rate existing in transmission systems equipped with such precorrection devices is less than 7% (required standard) and the intermodulation rate is less than $-60$ dB (the standard being $-5$ dB) in the whole frequency band and even outside the television channel.

The output power of an amplification structure is multiplied by 2.5 with such a precorrection device, with improved performances.

The invention is not limited to the embodiment described and shown, and it should be noted that this structure is applicable in television-signal transmission systems with separate channels or common channels, for metric waves or decimetric waves. This device is also applicable to signal-transmission systems other than television signals, in other frequency ranges, when their performances are limited by nonlinearities of order 3.

What is claimed is:

1. In a signal transmission system having an amplifier power stage and a device for precorrection of non-linear products introduced by said amplifier power stage of the system, the precorrection device comprising:
    a signal input coupled through a first power dispatcher to a principle linear channel and to a subsidiary channel wherein said subsidiary channel includes a non-linearity product generator which non-linearity generator comprises a second power dispatcher feeding in parallel a linear amplification channel and a non-linear amplification channel, and a subtractor effecting the difference between the output signal of said linear amplification channel and the output signal of said non-linear amplification channel to generate only non-linearity signals opposite in phase to said non-linearity products to be corrected;

an output adder connected to the outputs of the principle channel and the subsidiary channel which outputs a signal which is the sum of the signal supplied by said two channels, wherein said principle channel comprises a third power dispatcher feeding in parallel two third power dispatcher linear amplification channels similar to the linear amplification channel of the non-linearity product generator, and an adder combining the output signals of said two third power dispatcher linear amplification channels which adder outputs a signal transmitted to said output adder, and a adjusting device for adjusting the amplitude of said non-linearity products being provided by the output of said output adder.

2. The system as claimed in claim 1, wherein, said nonlinear channel of the nonlinearity product generator comprising in series an amplifier and an attenuator and the linear channel comprising in series an attenuator and an amplifier, the linear channels of the principal channel comprise in series an attenuator and an amplifier having the same phase and group delay time characteristics and the same amplitude-frequency characteristic as those of the nonlinearity product generator.

3. The system as claimed in one of claims 1 or 2, wherein said adjusting device comprises two attenuators disposed respectively at the input and at the output of the device whose adjustment determines the precorrection level while maintaining the output power constant, the transmittance of the precorrection device being thus maintained constant.

4. The system as claimed in claim 3, further comprising a control loop for feeding a portion of the output signal of said power amplifier stage which control loop supplies, after comparison with a reference signal, a control signal to said electrically controllable input attenuator, whereby the output power of said power amplifier stage is maintained constant, and the adjustment of said precorrection level is defined by said output attenuator.

5. The system as claimed in claim 4, wherein there is further provided a measuring device for measuring, in use, nonlinearity products generated by said power amplifier stage, said measuring device supplying a control signal to said electrically controllable output attenuator of said nonlinearity product precorrection device so as to effect permanent and automatic minimization of these products.

* * * * *